United States Patent
Fujimori

(10) Patent No.: US 9,183,988 B2
(45) Date of Patent: Nov. 10, 2015

(54) CHIP COMPONENT, SUBSTRATE AND ELECTRONIC APPARATUS

(75) Inventor: Kotaro Fujimori, Tokyo (JP)

(73) Assignees: Sony Corporation, Tokyo (JP); Sony Mobile Communications Inc., Tokyo (JP)

( * ) Notice: Subject to any disclaimer, the term of this patent is extended or adjusted under 35 U.S.C. 154(b) by 84 days.

(21) Appl. No.: 13/489,028

(22) Filed: Jun. 5, 2012

(65) Prior Publication Data

US 2013/0003334 A1  Jan. 3, 2013

Related U.S. Application Data

(60) Provisional application No. 61/503,831, filed on Jul. 1, 2011.

(51) Int. Cl.
| | |
|---|---|
| H01F 5/00 | (2006.01) |
| H01G 4/40 | (2006.01) |
| H01G 4/38 | (2006.01) |
| H01C 1/16 | (2006.01) |
| H01G 4/228 | (2006.01) |
| H05K 1/02 | (2006.01) |
| H05K 1/18 | (2006.01) |
| H01F 17/00 | (2006.01) |

(52) U.S. Cl.
CPC .. *H01G 4/40* (2013.01); *H01C 1/16* (2013.01); *H01F 5/00* (2013.01); *H01G 4/228* (2013.01); *H01G 4/38* (2013.01); *H05K 1/029* (2013.01); *H01F 2017/0026* (2013.01); *H05K 1/185* (2013.01); *H05K 2201/10212* (2013.01); *H05K 2201/10636* (2013.01); *H05K 2203/173* (2013.01)

(58) Field of Classification Search
CPC ..................... H01F 5/00; H01F 27/00–27/30
USPC ............................. 336/65, 83, 192, 200, 232
See application file for complete search history.

(56) References Cited

U.S. PATENT DOCUMENTS

| 7,394,645 B2 * | 7/2008 | Takahashi | .................. 361/303 |
| 2008/0274697 A1 | 11/2008 | Ito | |
| 2009/0080137 A1 * | 3/2009 | Togashi | ..................... 361/282 |

* cited by examiner

*Primary Examiner* — Tuyen Nguyen
(74) *Attorney, Agent, or Firm* — Oblon, McClelland, Maier & Neustadt, L.L.P.

(57) ABSTRACT

A chip component is provided with a block including a dielectric, input and output terminals, which are the first and second terminals that are provided on the surface of the block, an adjustment terminal that is a third terminal that includes an internal electrode extended into the block and that is provided on the surface of the block, and at least two inter-terminal circuits that are provided in the block and that are connected between at least two sets of two terminals of the first, second, and third terminals.

15 Claims, 18 Drawing Sheets

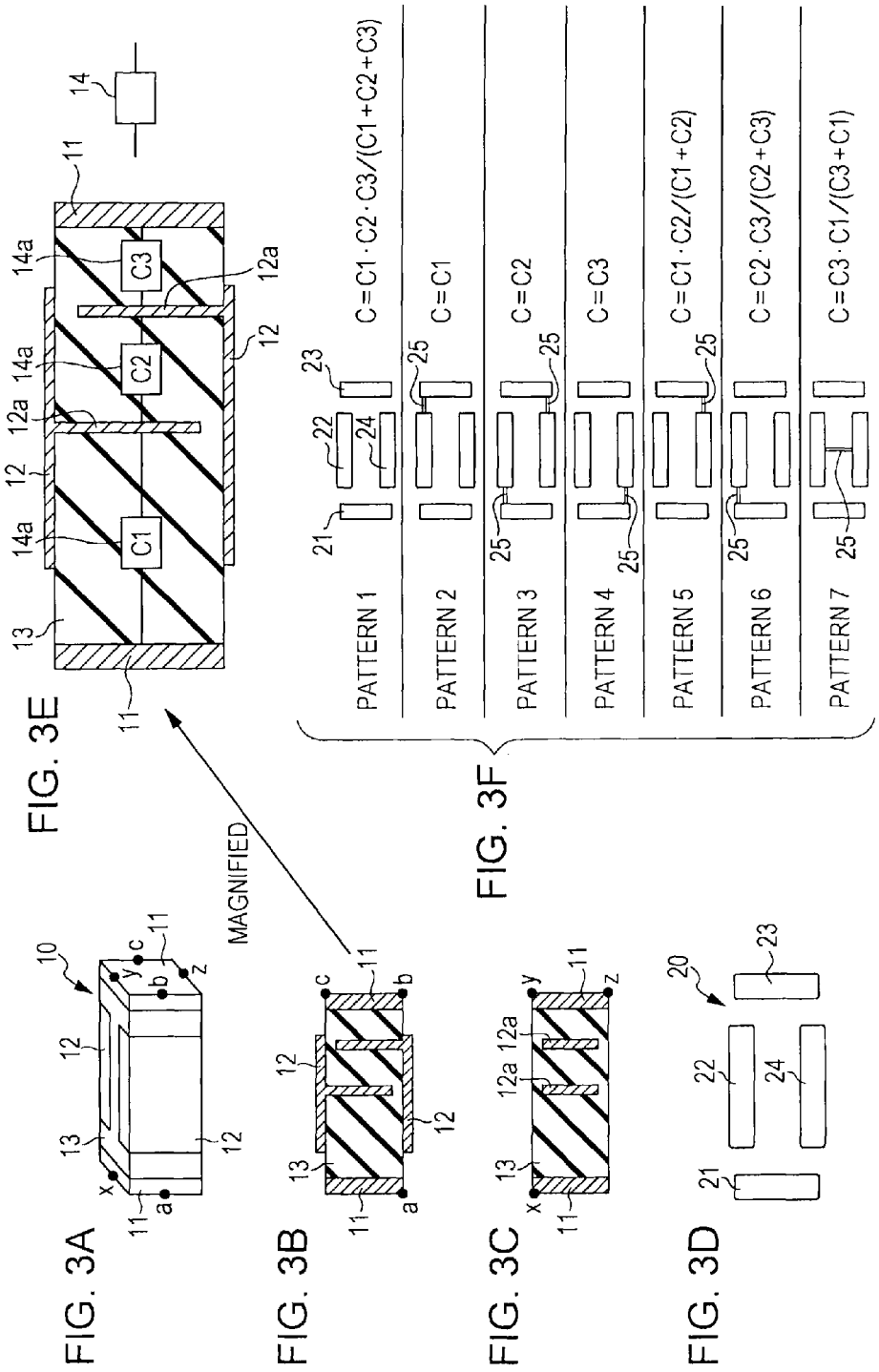

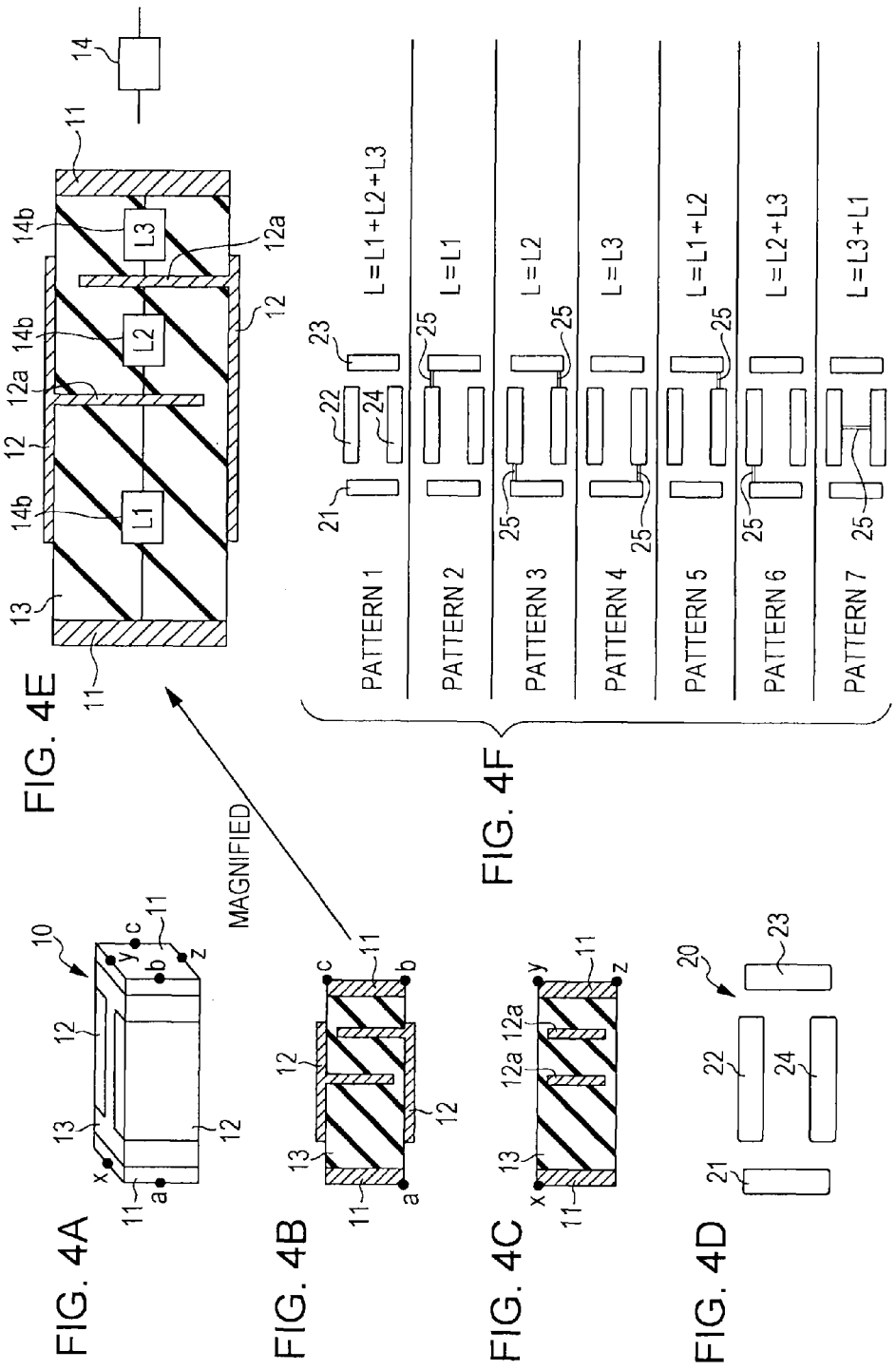

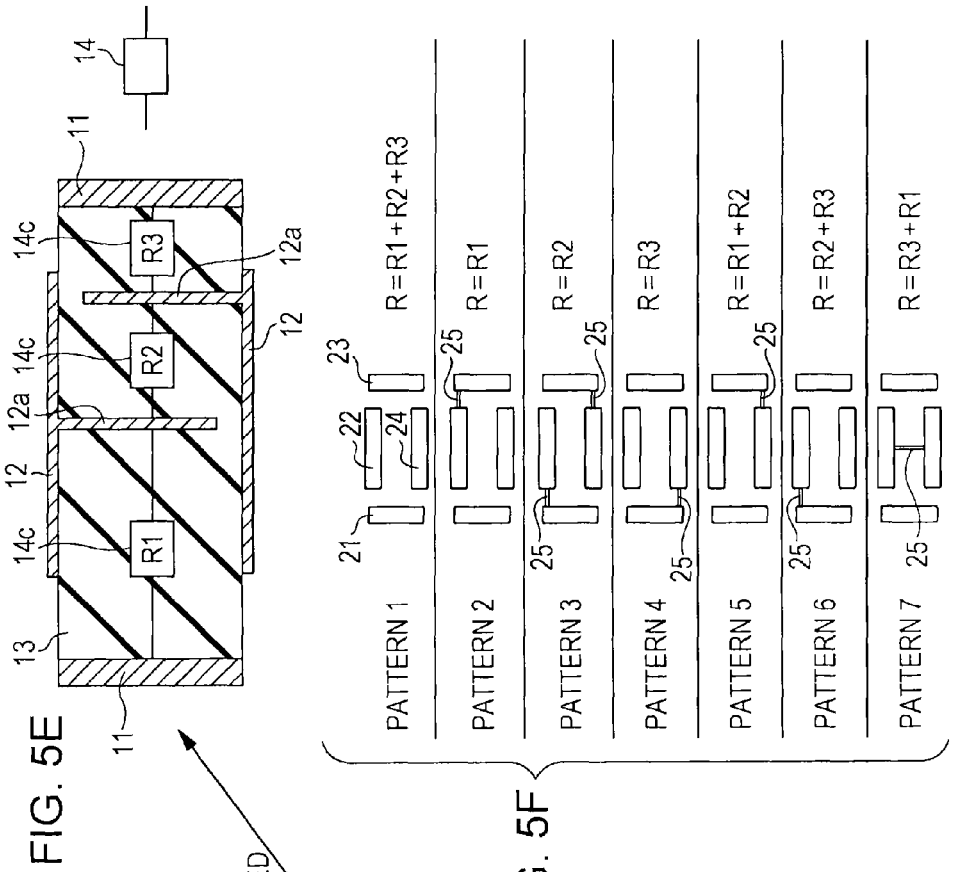
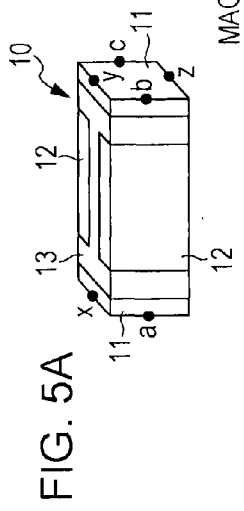
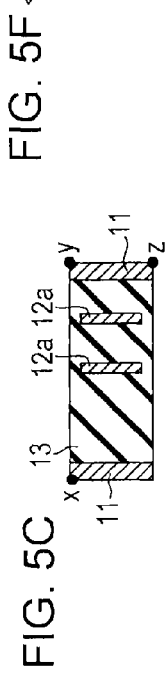
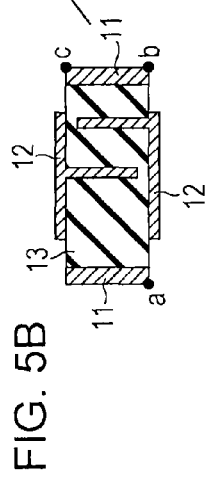
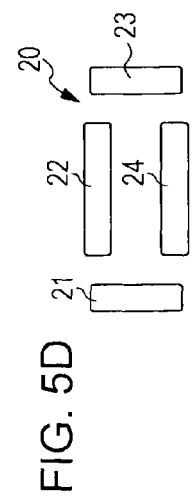
FIG. 5A  FIG. 5B  FIG. 5C  FIG. 5D  FIG. 5E  FIG. 5F

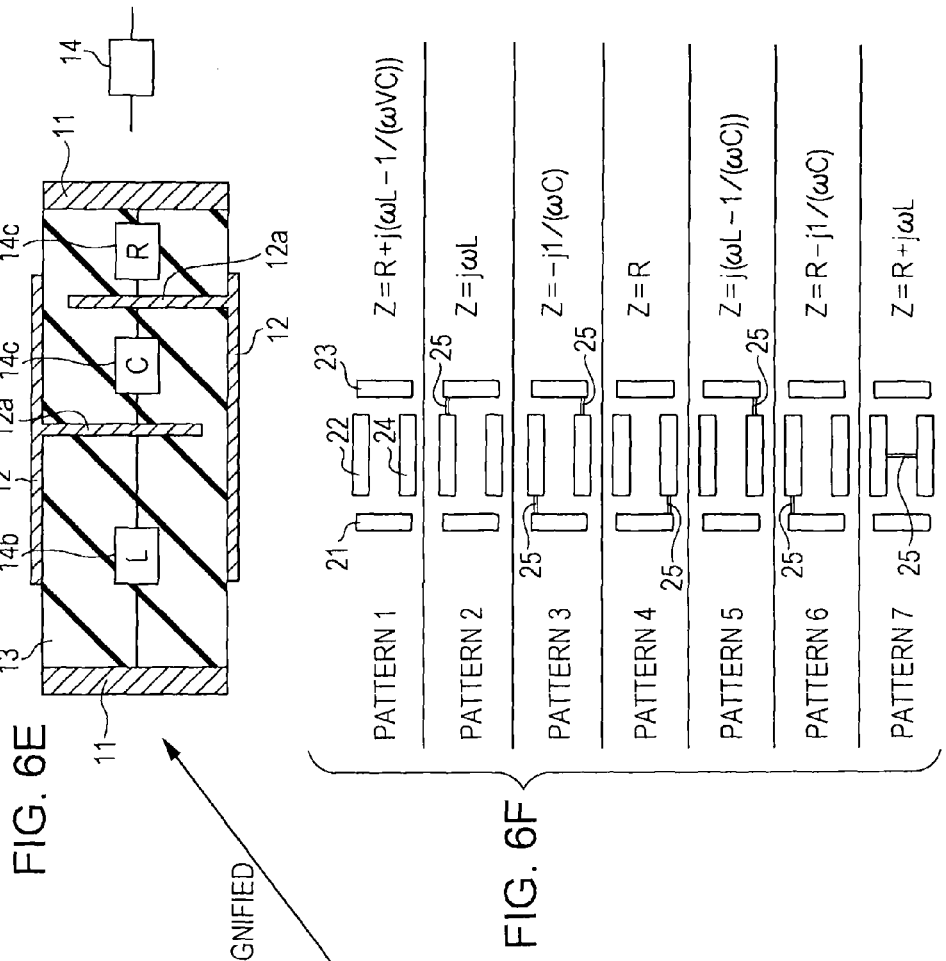

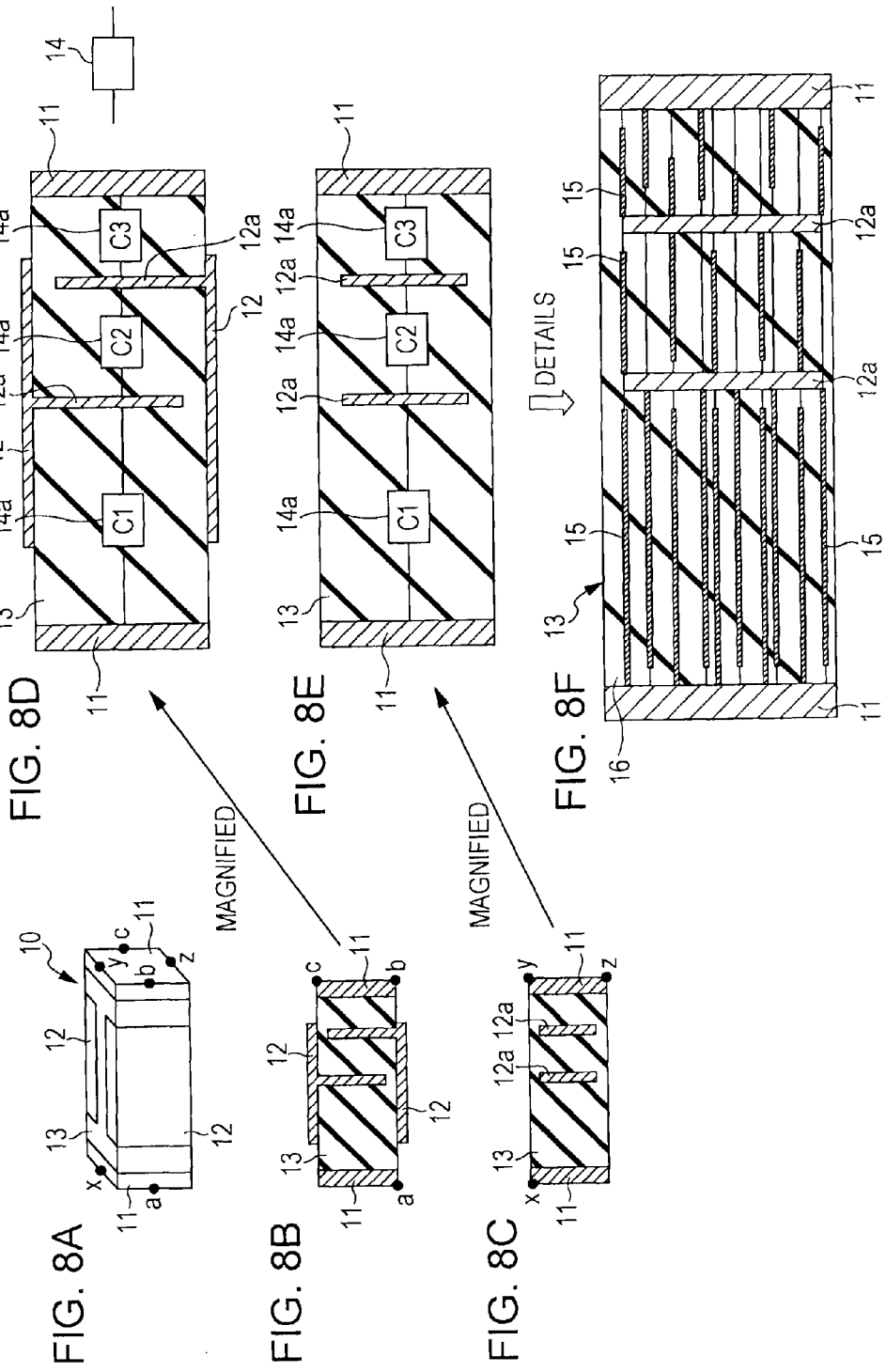

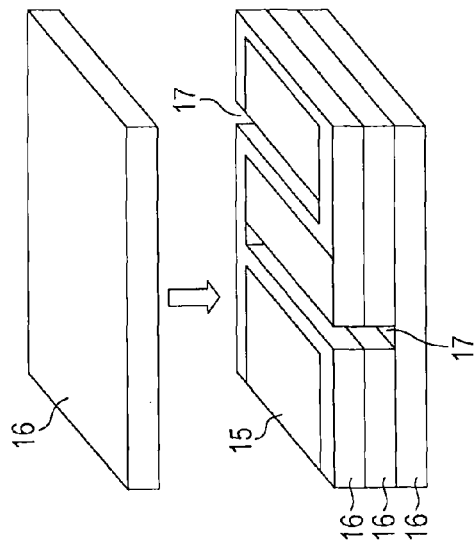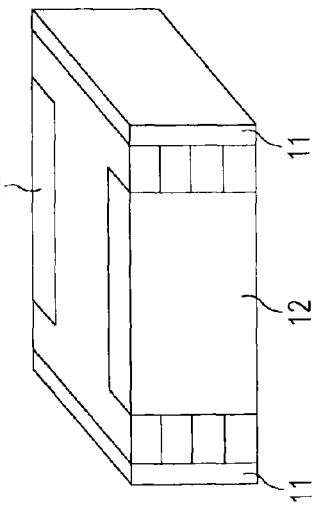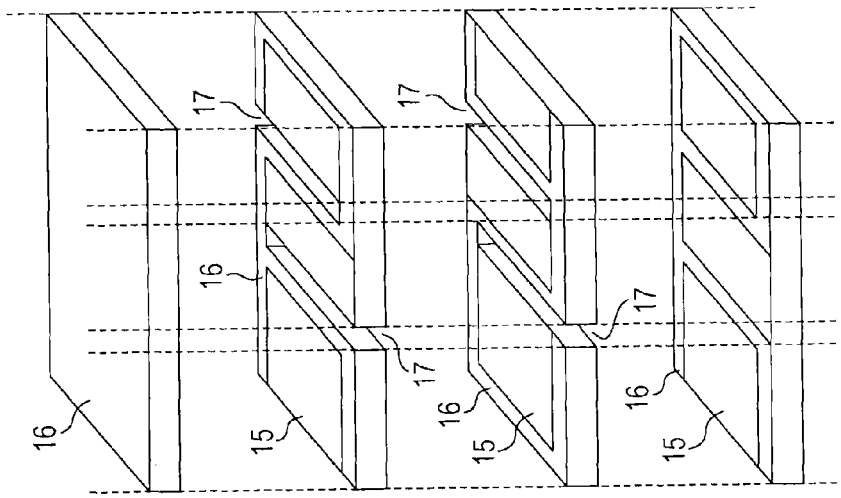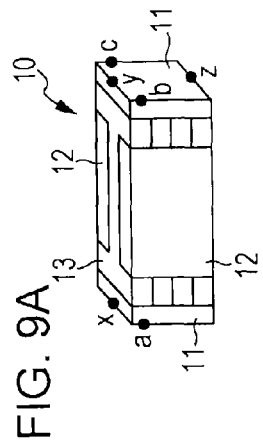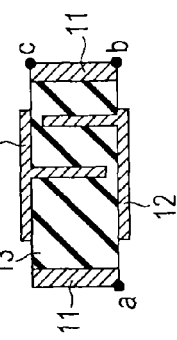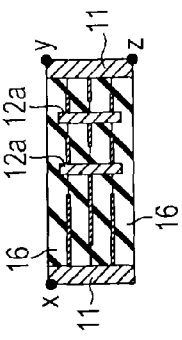

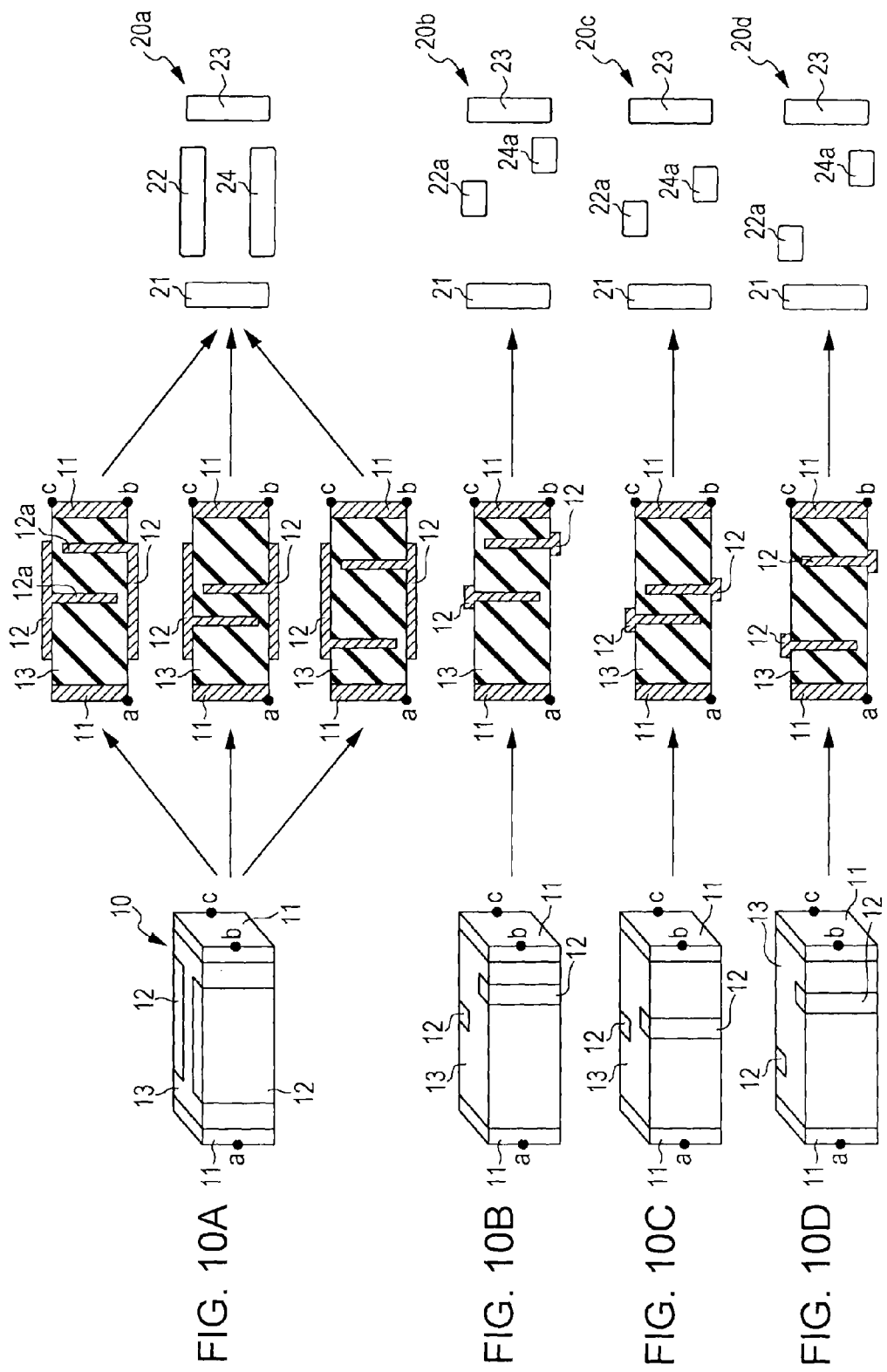

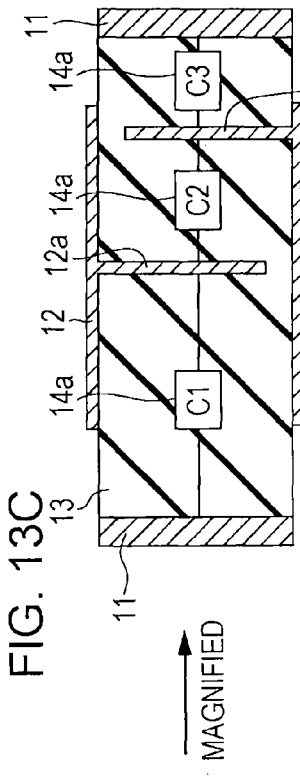
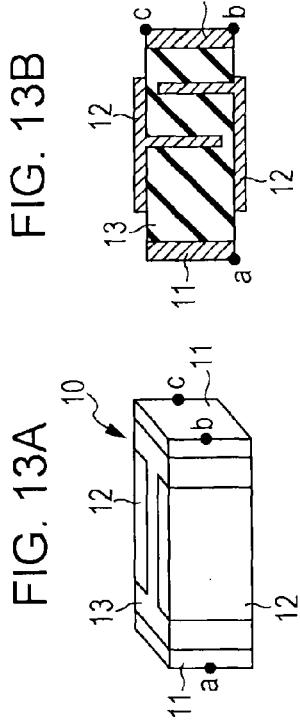
FIG. 13A
FIG. 13B
FIG. 13C
INTER-TERMINAL CAPACITANCE
$C = C_1 \cdot C_2 \cdot C_3 / (C_1 + C_2 + C_3)$
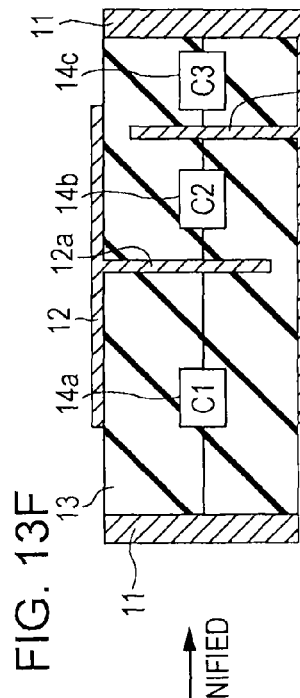
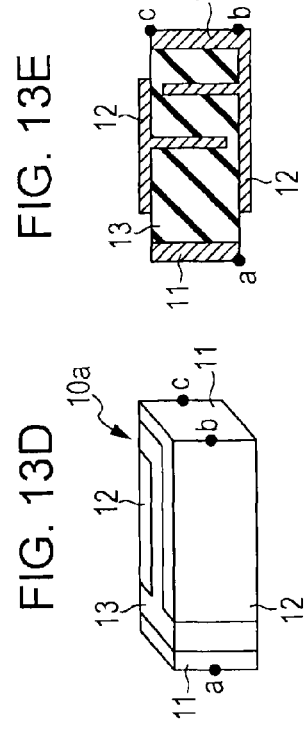
FIG. 13D
FIG. 13E
FIG. 13F
INTER-TERMINAL CAPACITANCE
$C = C_1 \cdot C_2 / (C_1 + C_2)$

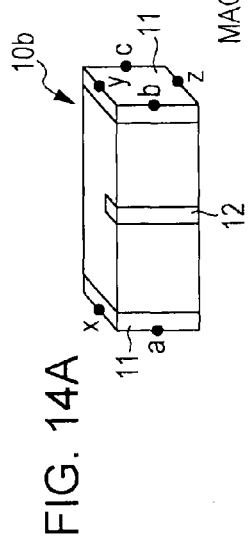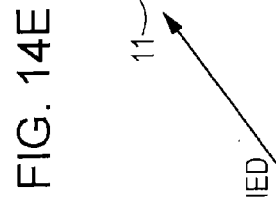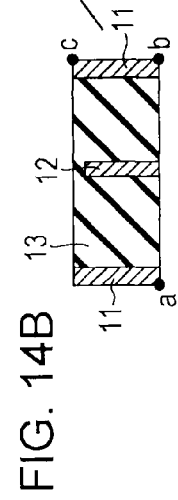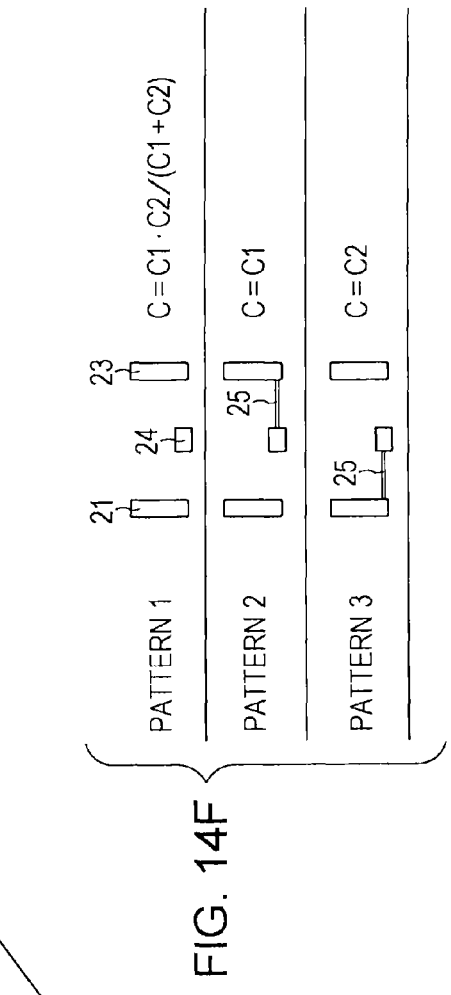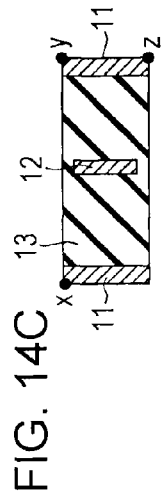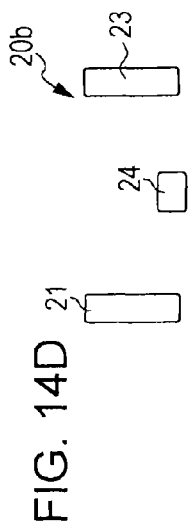

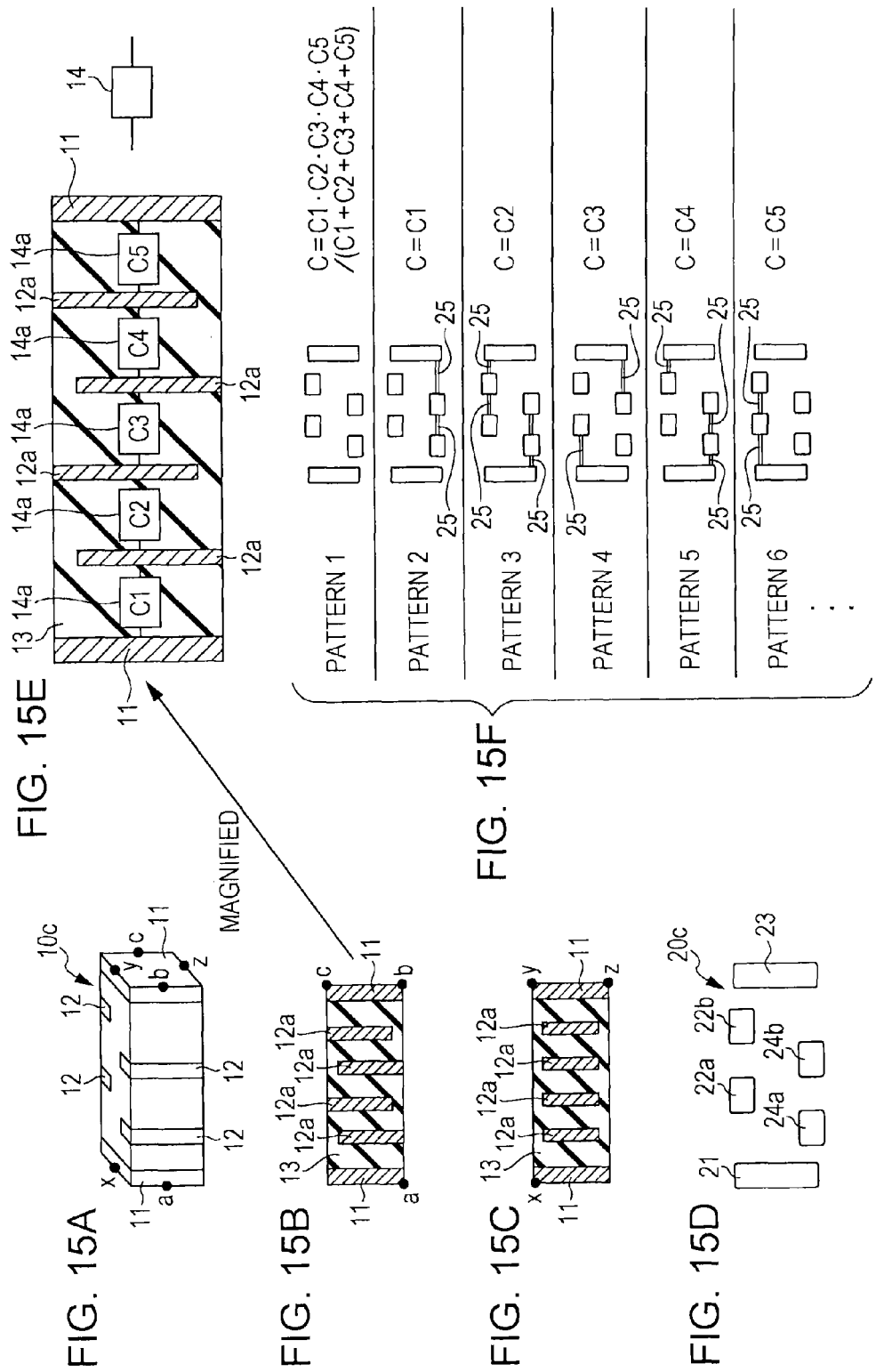

CHIP COMPONENT, SUBSTRATE AND ELECTRONIC APPARATUS

CROSS REFERENCE TO RELATED APPLICATION

The present application claims the benefit of the earlier filing date of U.S. provisional application 61/503,831 filed on Jul. 1, 2011, the entire contents of which being incorporated herein by reference.

TECHNICAL FIELD

The present disclosure relates to a chip component, substrate and electronic apparatus that includes the chip component, and particularly relates to a chip component that can adjust, for example, a constant thereof, and a circuit substrate including the chip component.

BACKGROUND ART

Hitherto, a chip component has been appreciated as an electronic component that is directly mounted on the surface of a circuit substrate through surface mounting technology that allows for downsizing an electronic component, increasing the mounting density, etc., in electronic equipment. A solder material is applied to the terminal part of the chip component or a connection part defined on a circuit substrate for mounting in advance, and the circuit substrate is heated in the state where the chip component is mounted on the connection part defined on the circuit substrate. Accordingly, the solder is melted and the chip component is fixed onto the circuit substrate. A known integration technology allows for incorporating a circuit element including a condenser, a resistor, an inductor, and so forth into the above-described chip component.

The constant, impedance, etc. of the above-described chip component is reliably determined for each chip component, and it is difficult to adjust the value once a choice is made.

Further, as one of methods of reducing an area where electric and electronic components are mounted on a circuit substrate, the method of incorporating a chip component included in a circuit into the substrate has been appreciated.

However, since the environment of the surroundings of components that are provided on the surface of the substrate is different from that of the surroundings of components that are provided in the substrate, the property of the chip component is changed, which poses a problem. For solving the problem, a circuit including the chip component needs to be adjusted after the chip component is incorporated into the substrate.

However, once that a chip component is selected, the constant or the like of the chip component itself is difficult to adjust. Accordingly, the circuit needs to be optimized by replacing the chip component and performing prototyping repeatedly, which gives rise to the problem of increased cost and time.

With such a background, the incorporation of components into the substrate is used mainly for a circuit which is highly tolerant of the property change.

SUMMARY

With the above-described background, the inventor of the present invention recognized the need for adjusting the constant or the like of a chip component without changing the internal configuration of the chip component or replacing the chip component.

According to an exemplary embodiment, a chip component including a block including a dielectric, first and second terminals that are provided on a surface of the block, a third terminal that includes an internal electrode extended into the block and that is provided on the surface of the block, and at least two inter-terminal circuits that are provided in the block and that are connected between at least two sets of two terminals of the first, second, and third terminals is provided.

The above-described configuration allows for adjusting the constant or the like of a chip component without changing the internal configuration of the chip component or replacing the chip component.

Further, the adjustment of the constant or the like of an incorporated circuit of a substrate where a chip component is incorporated, which has been made with difficulty, is facilitated. Accordingly, a chip component can be easily incorporated into a circuit which calls for precision.

BRIEF DESCRIPTION OF DRAWINGS

FIGS. 3(a) to 3(f) are illustrations of chip components including three condensers (or capacitance elements C1, C2, and C3) as inter-terminal circuits.

FIGS. 4(a) to 4(f) are illustrations of chip components including three inductors (or inductance elements L1, L2, and L3) as the inter-terminal circuits.

FIGS. 5(a) to 5(f) are illustrations of chip components including three resistors (or resistance elements R1, R2, and R3) as the inter-terminal circuits.

FIGS. 6(a) to 6(f) are illustrations of chip components including a condenser (C), an inductor (L), and a resistor (R) as the inter-terminal circuits.

FIGS. 8(a) to 8(f) are illustrations of an exemplary method of achieving the inter-terminal circuits.

FIGS. 9(a) to 9(f) are diagrams illustrating an exemplary process of manufacturing the chip components that are shown in FIG. 8.

FIGS. 10(a) to 10(d) are illustrations of the advantages of configurations that are attained by increasing the widths of the adjustment terminals.

FIGS. 13(a) to 13(f) are diagrams illustrating exemplary modifications of the chip component.

FIGS. 14(a) to 14(f) are illustrations of exemplary configurations of chip components including a single adjustment terminal.

FIGS. 15(a) to 15(f) are illustrations of exemplary configurations of chip components including four adjustment terminals.

DESCRIPTION OF EMBODIMENTS

Hereinafter, preferred embodiments will be described in detail with reference to drawings.

Figure 1A:
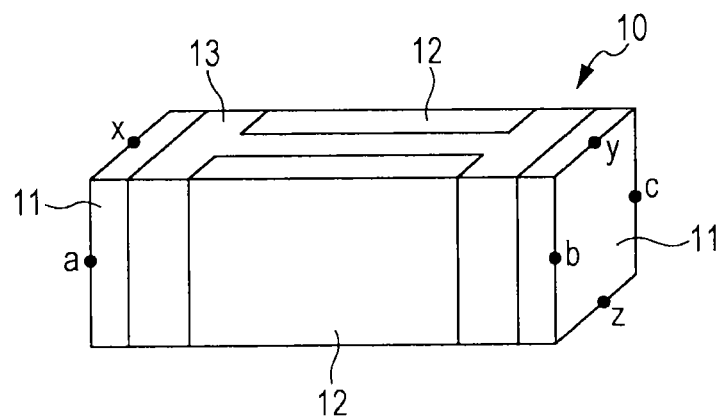
FIGS. 1(a) and 1(b) show exemplary external views of a chip component having a typical configuration according to an embodiment.
Figure 1B:
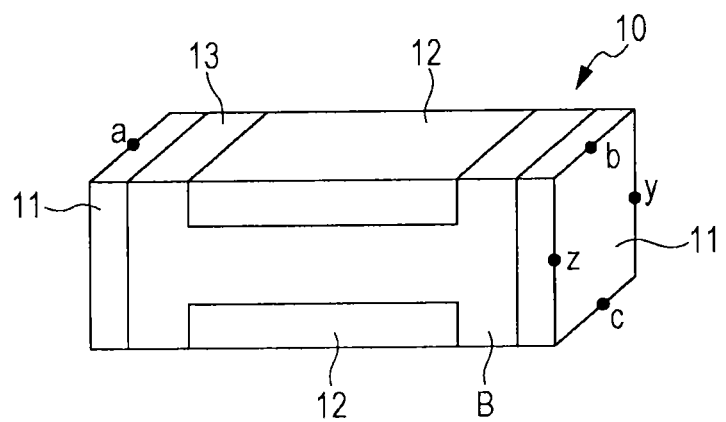
Figures 2A, 2B, 2C, 2D:
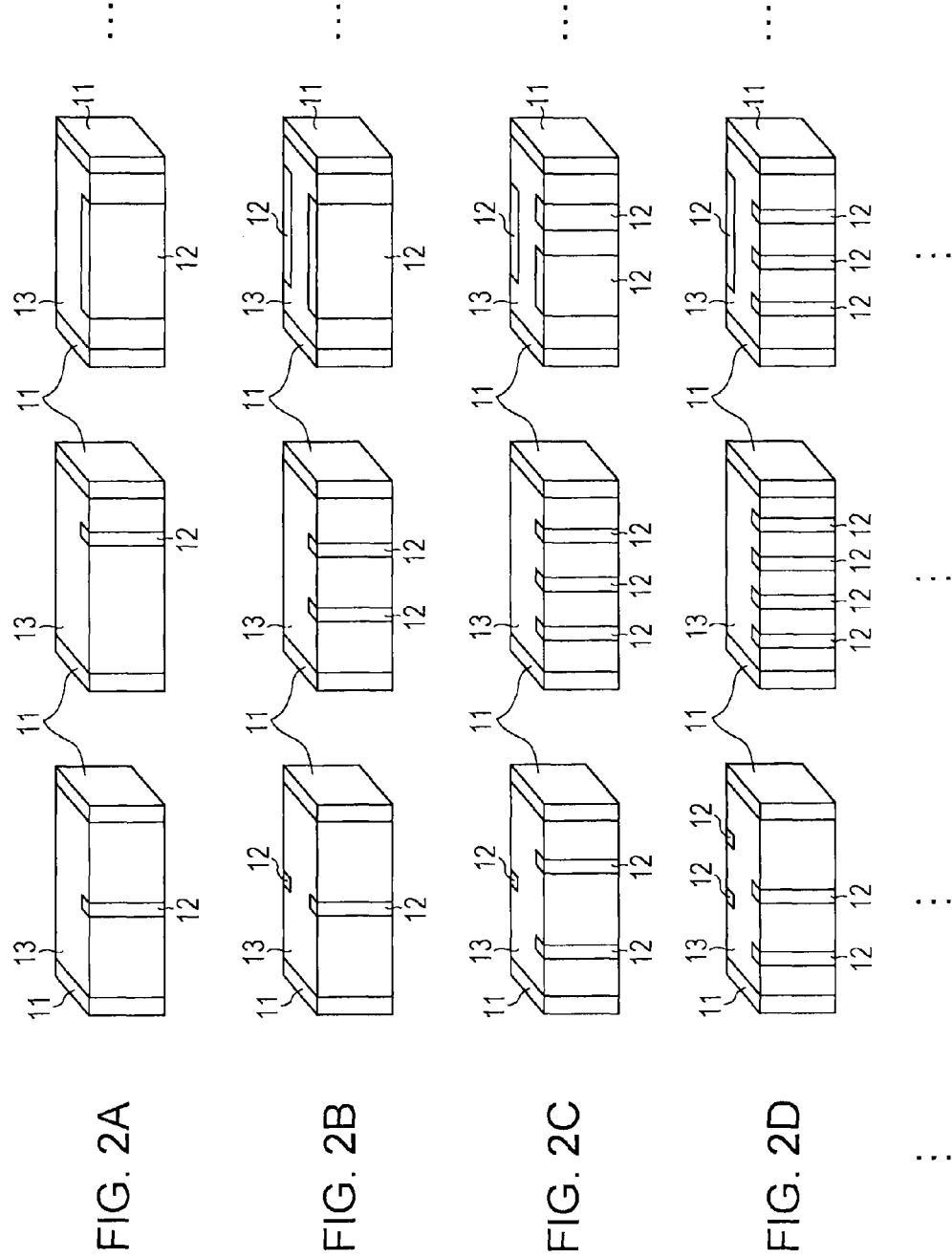
FIGS. 2(a) to 2(d) show exemplary external views of chip components according to an embodiment, which individually correspond to the examples where the numbers of adjustment terminals 12 are 1 to 4.

First, exemplary external views of a chip component (also simply referred to as a chip) having a typical configuration according to the present embodiment are shown in FIGS. 1(a) and 1(b). FIG. 1(a) and FIG. 1(b) are external views of the same chip component viewed from different points.

A chip component 10 includes input and output terminals 11 which are first and second terminals that are provided on the surfaces of both end parts of a dielectric block (substrate) 13 provided as an almost rectangular parallelepiped-shaped dielectric (insulator). The chip component 10 further includes at least one adjustment terminal 12 which is a third terminal provided on the block surface lying between both the end parts. Here, two adjustment terminals 12 are shown.

For each of the chip components 10, at least one circuit (inter-terminal circuit) connected between at least one set of two terminals (arbitrary two terminals of the input and output terminals 11 and the adjustment terminals 12) is provided in the dielectric block 13. The details of the inter-terminal circuit will be described later.

As shown in FIG. 1(b), the input and output terminals 11 and the adjustment terminals 12 are exposed at least one face (underside face B) of the chip component 10 as connection terminals. The face is used as a face mounted on the substrate.

The chip component 10 allows for changing the constants (or impedances and/or properties) of the chip component 10 by establishing an electrical connection between at least two sets of two terminals of the input and output terminals 11 and the adjustment terminals 12. Which terminal is connected to which terminal is determined based on connection patterns that will be described later. An object to be changed by establishing the connection between arbitrary two terminals of the input and output terminals 11 and the adjustment terminals 12 may be the input-and-output property of the chip component. The input-and-output property may include a frequency property, a temperature property, a bias property, and so forth.

A change in the constants or the like corresponds to the changing of an (equivalent) circuit provided between the input and output terminals of the chip.

Exemplary external views of the chip component of the present embodiment, which are attained when the number of the adjustment terminal(s) 12 is 1, 2, 3, and 4, are individually shown in FIGS. 2(a) to (d). As is clear from the drawings, even though the number of the adjustment terminal(s) 12 is the same, the arrangement position, the width, and so forth of the adjustment terminal(s) 12 may be different. Although not shown, the under face of each of the chip components that are shown in FIGS. 2(a) to 2(d) is symmetrical with the top face.

FIGS. 3(a) to 3(f) are illustrations of the chip component including three condensers 14a (C1, C2, and C3) as inter-terminal circuits 14.

FIG. 3(a) shows an external view of the chip component 10. FIG. 3(b) shows a section view obtained by cutting the chip component 10 along a plane passing through intermediate points a, b, and c that are defined on ridgelines of the end parts (a face parallel to the mounting face). FIG. 3(c) shows a section view obtained by cutting the chip component 10 along a plane passing through intermediate points x, y, and z that are defined on ridgelines of the end parts (a face perpendicular to the mounting face). FIG. 3(d) shows an exemplary foot pattern which is the pattern of conductors abutting on the terminal parts that are provided on the mounting face (underside face) of the chip component 10, which is provided on the surface of the substrate where the chip component 10 is mounted. The exemplary foot pattern includes pads 21 and 23 abutting on the individual input and output terminals 11 of both the ends, and pads 22 and 24 that individually abut on a pair of the adjustment terminals 12. When the chip component 10 is mounted on a circuit substrate, for example, the position of the chip component 10 is determined so that the connection terminals of the underside face of the chip component 10 abut on the pads 21 to 24 of a foot pattern 20 provided on the surface of the circuit substrate. The constants (or impedances and/or properties) of the chip component 10 can be adjusted by changing the state of connections between arbitrary pads.

As shown in FIG. 3(e), every adjustment terminal 12 includes an internal electrode 12a extending into the dielectric block 13 of the chip component. The condenser C1 is connected (provided) between one of the input and output terminals 11 and one of the adjustment terminals 12. The condenser C2 is connected (provided) between one of the adjustment terminals 12 and the other adjustment terminal 12. The condenser C3 is connected (provided) between the other adjustment terminal 12 and the other input and output terminal 11.

FIG. 3(f) shows connection patterns 1 to 7 establishing connections between the pads of the foot pattern 20 and the values of inter-input and output-terminal capacitances (composite capacitances) C thereof. The connection pattern 1 indicates a connection pattern attained by establishing no connection between the pads. The connection pattern 2 indicates a connection pattern attained by establishing a connection between the pads 22 and 23 (here, a short circuit is established with a connection member 25 including a conductive material). The connection pattern 3 indicates a connection pattern attained by establishing a connection between the pads 21 and 22, and that between the pads 23 and 24. The connection pattern 4 indicates a connection pattern attained by establishing a connection between the pads 21 and 24. The connection pattern 5 indicates a connection pattern attained by establishing a connection between the pads 23 and 24. The connection pattern 6 indicates a connection pattern attained by establishing a connection between the pads 21 and 22. The connection pattern 7 indicates a connection pattern attained by establishing a connection between the pads 22 and 24.

Thus, the value of the inter-input and output-terminal capacitance C of the chip component 10 varies with the connection patterns 1 to 7. Therefore, a desired value (or a value close thereto) of the inter-input and output-terminal capacitance C can be obtained by selecting a specified connection pattern.

FIGS. 4(a) to 4(f) are illustrations of the chip component including three inductors 14b (L1, L2, and L3) as the inter-terminal circuits 14. FIGS. 4(a) to 4(d) are diagrams that are individually equivalent to FIGS. 3(a) to 3(d).

Incidentally, there are no particular limits to the specific formation of the connection members 25 that are provided as members used to establish a connection between the terminals. For example, an arbitrary electrically-connectable element including conductive adhesive paper, a jumper, a lead wire, a chip component, and so forth can be used. Further, after determining the pattern of connections between the terminals of a chip component in the stage of making a prototype of a device including the concerned chip component, the substrate's foot pattern itself may be determined to be a pattern reflecting the concerned connection pattern.

As shown in FIG. 4(e), every adjustment terminal 12 includes the internal electrode 12a extending into the dielectric block 13 of the chip component. The inductor L1 is connected (provided) between one of the input and output terminals 11 and one of the adjustment terminals 12. The inductor L2 is connected (provided) between one of the adjustment terminals 12 and the other adjustment terminal 12. The inductor L3 is connected (provided) between the other adjustment terminal 12 and the other input and output terminal 11.

FIG. 4(f) shows connection patterns 1 to 7 establishing connections between the pads of the foot pattern 20 and the values of inter-input and output-terminal inductances (composite inductances) L thereof. The connection pattern 1 indicates a connection pattern attained when no connection is established between the pads. The connection pattern 2 indicates a connection pattern attained by establishing a connection between the pads 22 and 23 (here, a short circuit is established). The connection pattern 3 indicates a connection pattern attained by establishing a connection between the pads 21 and 22, and that between the pads 23 and 24. The connection pattern 4 indicates a connection pattern attained by establishing a connection between the pads 21 and 24. The connection pattern 5 indicates a connection pattern attained by establishing a connection between the pads 23 and 24. The connection pattern 6 indicates a connection pattern attained by establishing a connection between the pads 21 and 22. The connection pattern 7 indicates a connection pattern attained by establishing a connection between the pads 22 and 24.

Thus, it shows that the value of the inter-input and output-terminal inductance L of the chip component 10 varies with the connection patterns 1 to 7. Therefore, a desired value (or a value close thereto) of the inter-input and output-terminal inductance L can be obtained by selecting a specified connection pattern.

FIGS. 5(a) to 5(f) are illustrations of the chip component including three resistors 14c (R1, R2, and R3) as the inter-terminal circuits 14. FIGS. 5(a) to 5(d) are individually equivalent to FIGS. 3(a) to 3(d).

As shown in FIG. 5(e), the resistor R1 is connected (provided) between one of the input and output terminals 11 and one of the adjustment terminals 12. The resistor R2 is connected (provided) between one of the adjustment terminals 12 and the other adjustment terminal 12. The resistor R3 is connected (provided) between the other adjustment terminal 12 and the other input and output terminal 11. Every adjustment terminal 12 includes the internal electrode 12a extended into the dielectric block 13 of the chip component.

FIG. 5(f) shows connection patterns 1 to 7 establishing connections between the pads of the foot pattern 20 and the values of inter-input and output-terminal resistances (composite resistances) R thereof. The connection pattern 1 indicates a connection pattern attained when no connection is established between the pads. The connection pattern 2 indicates a connection pattern attained by establishing a connection between the pads 22 and 23 (here, a short circuit is established). The connection pattern 3 indicates a connection pattern attained by establishing a connection between the pads 21 and 22, and that between the pads 23 and 24. The connection pattern 4 indicates a connection pattern attained by establishing a connection between the pads 21 and 24. The connection pattern 5 indicates a connection pattern attained by establishing a connection between the pads 23 and 24. The connection pattern 6 indicates a connection pattern attained by establishing a connection between the pads 21 and 22. The connection pattern 7 indicates a connection pattern attained by establishing a connection between the pads 22 and 24.

Thus, it shows that the value of the inter-input and output-terminal resistance R of the chip component 10 varies with the connection patterns 1 to 7. Therefore, a desired value (or a value close thereto) of the inter-input and output-terminal resistance R can be obtained by selecting a specified connection pattern.

According to the configurations of the chip component 10, which are shown in FIGS. 3 to 5, a plurality of circuit elements of the same type is used as the inter-terminal circuits 14. However, different kinds of circuit elements may be used as well. Namely, the inter-terminal circuit 14 may be a separate circuit element including the resistance R, the condenser (capacitor) C, the inductor L, and so forth, or a circuit including a combination of those circuit elements. Further, the circuit elements may be elements other than the L, the C, and the R. For example, the circuit elements may include a bead, a varistor, a thermistor, a varicap, a diode, a switch, and so forth.

FIGS. 6(a) to 6(f) are illustrations of the chip component including the condenser 14a (C), the inductor 14b (L), and the resistor 14c (R) as the inter-terminal circuits 14. FIGS. 6(a) to 6(d) are individually equivalent to FIGS. 3(a) to 3(d).

As shown in FIG. 6(e), every adjustment terminal 12 includes the internal electrode 12a extended into the dielectric block 13 of the chip component. The inductor L is connected (provided) between one of the input and output terminals 11 and one of the adjustment terminals 12. The condenser C is connected (provided) between one of the adjustment terminals 12 and the other adjustment terminal 12. The resistance R is connected (provided) between the other adjustment terminal 12 and the other input and output terminal 11. The inter-terminal circuit 14 is configured as a separate circuit element including basic elements (L, C, and R). However, the inter-terminal circuit 14 may be configured as a combination of a plurality of elements.

FIG. 6(f) shows connection patterns 1 to 7 establishing connections between the pads of the foot pattern 20 and the values of inter-input and output-terminal impedances (composite impedances) Z thereof. The connection pattern 1 indicates a connection pattern attained when no connection is established between the pads. The connection pattern 2 indicates a connection pattern attained by establishing a connection between the pads 22 and 23 (here, a short circuit is established). The connection pattern 3 indicates a connection pattern attained by establishing a connection between the pads 21 and 22, and that between the pads 23 and 24. The connection pattern 4 indicates a connection pattern attained by establishing a connection between the pads 21 and 24. The connection pattern 5 indicates a connection pattern attained by establishing a connection between the pads 23 and 24. The connection pattern 6 indicates a connection pattern attained by establishing a connection between the pads 21 and 22. The connection pattern 7 indicates a connection pattern attained by establishing a connection between the pads 22 and 24.

Thus, the value of the inter-input and output-terminal impedance Z of the chip component 10 varies with the connection patterns 1 to 7. Therefore, a desired value (or a value close thereto) of the inter-input and output-terminal impedance Z can be obtained by selecting a specified connection pattern.

Figure 7:
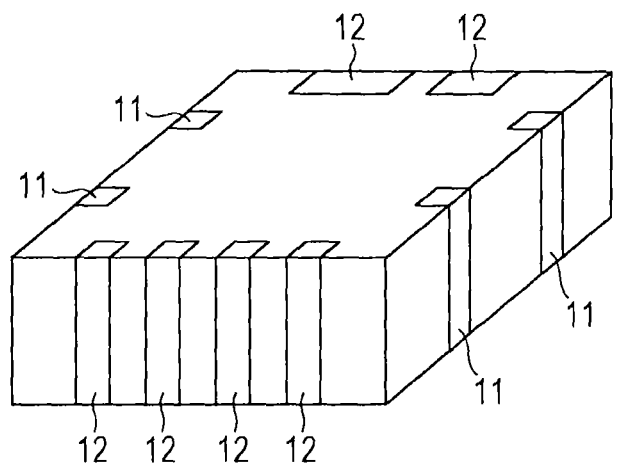
FIG. 7 shows an exemplary external view of a chip component including four input and output terminals and six adjustment terminals.

For the chip components that are shown in FIG. 2, only examples where the number of the input and output terminals 11 is two are shown. However, the number may exceed two. FIG. 7 shows an exemplary eternal view of a chip component including four input and output terminals 11 and six adjustment terminals. As for the four input and output terminals 11, which terminal is an input terminal and which terminal is an output terminal is not concerned. It may be configured that a single terminal serves as an input terminal and an output terminal. Typically, two inputs and two outputs are provided.

There are no particular limits to which terminal is connected to which terminal, and the number of the connections. The number of each of the input and output terminal(s) 11, and the adjustment terminal(s) 12 is an arbitrary number which is at least one.

There are no particular limits to the method of achieving the inter-terminal circuit 14. Taking the chip components 10 that are shown in FIG. 3 as examples, an exemplary achievement method will be described with reference to FIGS. 8(a) to 8(f). FIGS. 8(a) to 8(c) are individually equivalent to FIGS. 3(a) to 3(c). According to the example, the inter-terminal circuit 14 is the condenser 14a.

FIG. 8(d) is a schematic diagram attained by magnifying FIG. 8(b), which shows the configurations of internal circuits that are provided between the terminals. FIG. 8(e) is a schematic diagram attained by magnifying FIG. 8(c), which shows the configurations of internal circuits that are provided between the terminals. FIG. 8(f) is a schematic diagram showing an example of an actual and specific configuration of FIG. 8(e). From the inside face of the input and output terminal 11 provided at the left end of the drawing, a plurality of electrode plates 15 is extended into the dielectric block 13, where the electrode plates 15 are perpendicular to the face and are parallel to each other. From the left face of the adjustment terminal 12 provided on the left, a plurality of the electrode plates 15 is extended so as to be perpendicular to the face and parallel to each other, and located midway between the electrode plates 15 extended from the input and output terminal 11. The adjacent electrode plates 15 present capacitance values that are determined based on the opposing areas and the permittivity of a dielectric provided therebetween. The total of those capacitance values becomes the composite capacitance of a condenser provided between the left-end input and output terminal 11 and the left adjustment terminal 12.

The same goes for the configurations of circuits and the composite capacitance that are attained between the left adjustment terminal 12 and the right adjustment terminal 12. The same further goes for the composite capacitance attained between the right adjustment terminal 12 and the right-end input and output terminal 11.

FIGS. 9(a) to 9(f) are diagrams illustrating an exemplary process of manufacturing the chip components 10 that are shown in FIG. 8. FIG. 9(a) shows an external view of the chip component 10. FIG. 9(b) shows a section view obtained by cutting the chip component 10 along a plane passing through intermediate points a, b, and c that are defined on ridgelines of the end parts (a face parallel to a mounting face). FIG. 9(c) shows a section view obtained by cutting the chip component 10 along a plane passing through intermediate points x, y, and z that are defined on ridgelines of the end parts (a face perpendicular to the mounting face).

FIG. 9(d) expresses at least two dielectric sheets 16 that are included in the dielectric block 13 and that are laminated on one another. On the dielectric sheet 16 provided as an intermediate layer, slits 17 are provided in areas that shall be the internal electrodes 12a of the adjustment terminals 12 later. Further, conductor layers that shall be the electrode plates 15 of the condensers are provided on the surface of a specified dielectric sheet 16.

Those dielectric sheets 16 are superimposed on one another and fired in a firing furnace as shown in FIG. 9(e). Consequently, the hard dielectric block 13 is provided. External electrodes are added to the dielectric block 13 by applying or printing a metal paste on both end parts that shall be the input and output terminals 11 and the side parts that shall be the adjustment terminals 12. At that time, the metal paste enters the slits 17 so that the electrode plates 15 are provided as internal electrodes that are continued to the adjustment terminals 12.

Incidentally, known technologies allow for integrating inter-terminal circuits other than the condensers so that the inter-terminal circuits can be incorporated into the chip component, though not shown.

Next, the advantages of configurations that are attained by increasing the widths of the adjustment terminals 12 will be described with reference to FIGS. 10(a) to 10(d).

The configuration of the chip component 10 illustrated in FIG. 10(a) is equivalent to that shown in FIG. 1. According to the configuration, the widths of the adjustment terminals are increased. Here, the width of the adjustment terminal 12 denotes the length (size) of the adjustment terminal 12 extending along a direction perpendicular to the face of the input and output terminal 11. The "increased width" denotes that a width covering the entire range where the arrangement of the internal electrode 12a is permitted, the entire range being defined on a side face of the block 13, is provided. Therefore, even though the arrangement position of the internal electrode 12a is changed, the position of the adjustment terminal 12 exposed at the side face of the chip component can be fixed without being affected thereby. As a result, a common foot pattern 20a can be used irrespective of the arrangement positions of the internal electrodes 12a as shown on the right end of FIG. 10(a).

On the other hand, according to a chip component adopting the adjustment terminals 12 with decreased widths as shown in FIGS. 10(b) to 10(d), the positions of the adjustment terminals 12 that are exposed at the side faces of the chip component vary based on the arrangement positions of the internal electrodes 12a. In that case, separate foot patterns 20b, 20c, and 20d, of which positions of the pads 22a and 24a corresponding to the adjustment terminal 12 are different from one other, may be prepared as shown on the right ends of FIGS. 10(b) to 10(d). However, the use of the adjustment terminals 12 having increased widths as shown in FIG. 10(a) may be more preferable. That is, when adopting the adjustment terminals 12 with increased widths, an external electrode shared among the adjustment terminals 12 can be adopted without the need for considering the positions of the internal electrodes 12a. In other words, the flexibility of the arrangement positions of the internal electrodes 12a is increased. Therefore, part of the manufacturing facility becomes sharable among chip components having different configurations.

Further, when the width of the adjustment terminal 12 is increased, a common foot pattern can be applied for chip components having different configurations. Therefore, it becomes possible to reduce the number of man-hours required to generate and verify foot patterns.

Figure 11B:
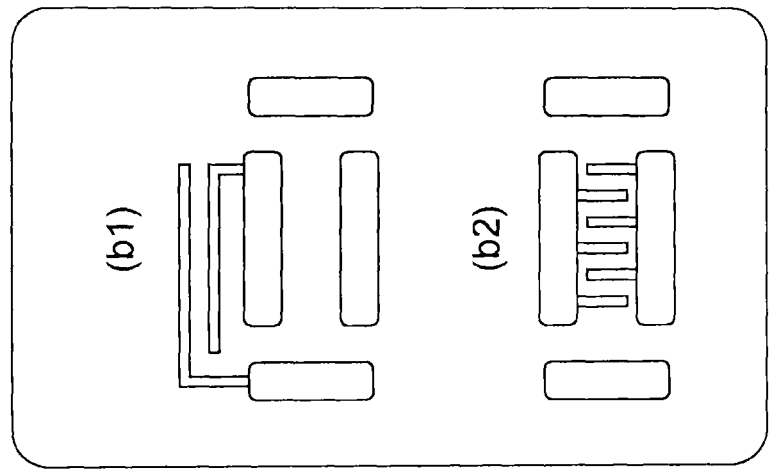
FIGS. 11(a) and 11(b) are illustrations of various styles of the inter-terminal connections.
Figure 11A:
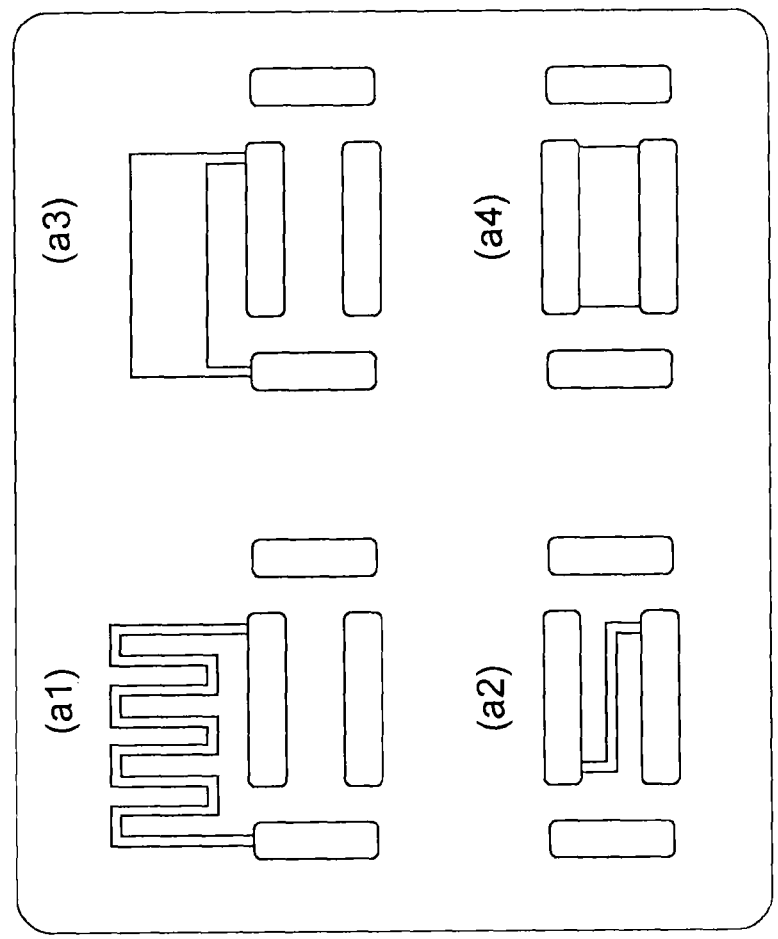

In addition to the formation of the connection members 25 shown in FIG. 3 and the like, various formations that are shown in FIGS. 11(a) and 11(b) may be adopted as the pattern of connections between the above-described terminals. Although each of connection members that are shown in FIG. 11(a) is provided to establish a direct current (DC) connection, whether the connection style is a DC connection or an AC connection does not matter. As shown in FIG. 11(b), the connection style may be the style for establishing an alternating connection. Here, an example where an inductive coupling and a capacitive coupling are provided between a conductor extended from a given terminal and that extended from a different terminal of the connection target is shown.

Figure 12A:
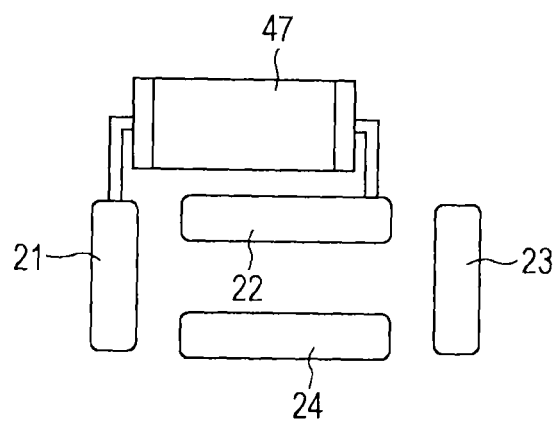
FIGS. 12(a) and 12(b) are illustrations of exemplary modifications of a connection member provided between terminals.
Figure 12B:
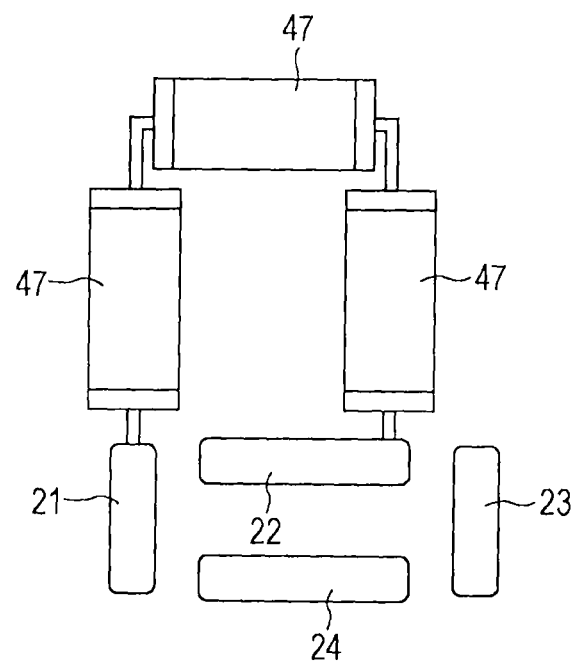

Further, a more complicated adjustment can be made by giving the constant effect or the filter effect to the connection members as an exemplary modification of the connection members provided between the terminals. The configuration is achieved by establishing a connection between the terminals via a chip component (external circuit component) 47 as shown in FIG. 12(*a*). A combination of a plurality of the chip components 47 may also be used as a connection member as shown in FIG. 12(*b*).

FIGS. 13(*a*) to 13(*f*) are diagrams illustrating exemplary modifications of the chip component. FIG. 13(*a*) shows the chip component 10 shown in FIG. 3 for convenience of reference, and FIG. 13(*d*) shows the exemplary modification. According to the chip component 10*a* of FIG. 13(*d*), a single input and output terminal 1 and a single adjustment terminal 12 are provided as a continuous conductor. Thus, even though the internal circuits of the chip components have the same configuration, it becomes possible to manufacture chip components having different constants (or impedances and/or properties) only with the addition of the step of establishing a connection between the electrodes of external terminals. Namely, the same material and the same configuration (exclusive of electrodes) can be used for different chip components.

In the foregoing descriptions, the chip components including a plurality of the adjustment terminals 12 have been described. However, a single adjustment terminal 12 may be provided as shown in FIGS. 14(*a*) to 14(*f*).

FIG. 14(*a*) shows an external view of a chip component 10*b*. FIG. 14(*b*) shows a section view obtained by cutting the chip component 10*b* along a plane passing through intermediate points a, b, and c that are defined on ridgelines of the end parts (a face parallel to a mounting face). FIG. 14(*c*) shows a section view obtained by cutting the chip component 10*b* along a plane passing through intermediate points x, y, and z that are defined on ridgelines of the end parts (a face perpendicular to the mounting face). FIG. 14(*d*) shows an exemplary foot pattern 20*b* which is the pattern of conductors abutting on terminal parts that are provided on the underside face of the chip component 10*b*, which is provided on the surface of a substrate where the chip component 10*b* is mounted. The exemplary foot pattern 20*b* includes pads 21 and 23 abutting on the input and output terminals 11 of both the ends, and a pad 24 abutting on a single adjustment terminal 12.

As shown in FIG. 14(*e*), the adjustment terminal 12 includes the internal electrode 12*a* extended into the dielectric block 13 of the chip component. The condenser C1 is connected (provided) between one of the input and output terminals 11 and the adjustment terminal 12. The condenser C2 is connected (provided) between the adjustment terminal 12 and the other adjustment terminal 12.

FIG. 14(*f*) shows connection patterns 1 to 3 establishing connections between the pads of the foot pattern 20*b* and the values of inter-input and output-terminal capacitances (composite capacitances) C thereof. The connection pattern 1 indicates a connection pattern attained by establishing no connection between the pads. The connection pattern 2 indicates a connection pattern attained by establishing a connection between the pads 23 and 24 (here, a short circuit is established with the connection member 25 including the conductive material). The connection pattern 3 indicates a connection pattern attained by establishing a connection between the pads 21 and 24. Compared to the chip component 10 shown in FIG. 3, the number of choices of obtainable constants is smaller. However, different values can be obtained for the same chip component as the constant between the input and output terminals 11 by selecting the pattern of connections between the terminals.

FIG. 14 show the condensers (capacitors) 14*a* as the inter-terminal circuit 14. However, a resistor, an inductor, and other elements can be adopted as stated above so as to allow for a change in inter-terminal impedance characteristic in the block.

FIGS. 15(*a*) to 15(*f*) are illustrations of exemplary configurations of a chip component 10*c* including four adjustment terminals 12. FIGS. 15(*a*) to 15(*f*) are diagrams that are equivalent to FIGS. 14(*a*) to 14(*f*).

As shown in FIG. 15(*d*), the foot pattern 20*c* corresponding to the chip component 10*c* includes four pads 22*a*, 22*b*, 24*a*, and 24*b* that are provided for the four adjustment terminals 12.

Although FIG. 15(*e*) shows an example where the condenser 14*a* is used as each of the inter-terminal circuits 14, the inter-terminal circuit 14 is not limited to a condenser.

Although many numbers are admissible as the number of the patterns of connections between the terminals of the chip component 10*c* based on the number and the arrangement positions of the connection members 25 in FIG. 15(*f*), only six representatives are shown herein.

Thus, the number of the adjustment terminal(s) 12 provided in the chip component may be an arbitrary number which is at least one.

Next, an embodiment of a circuit substrate including the chip component 10 will be described with reference to FIGS. 16(*a*) to 16(*c*) as exemplary applications of the above-described chip component 10. The chip component 10 described herein may include each of the above-described exemplary modifications.

Figure 16A:
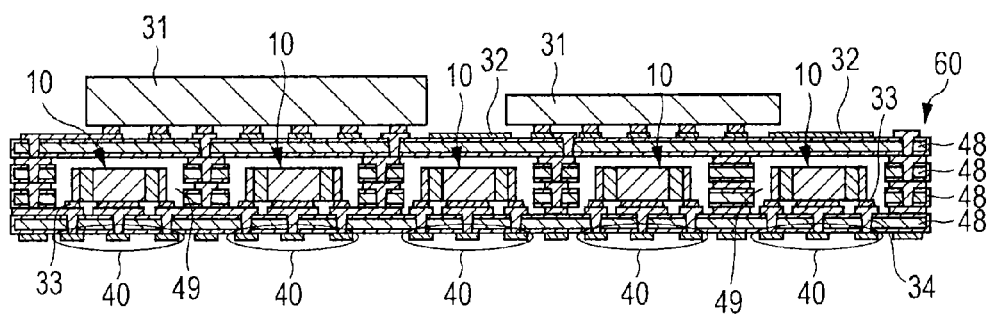
FIGS. 16(a) to 16(c) are illustrations of an embodiment of a circuit substrate including the chip component.
Figure 16B:
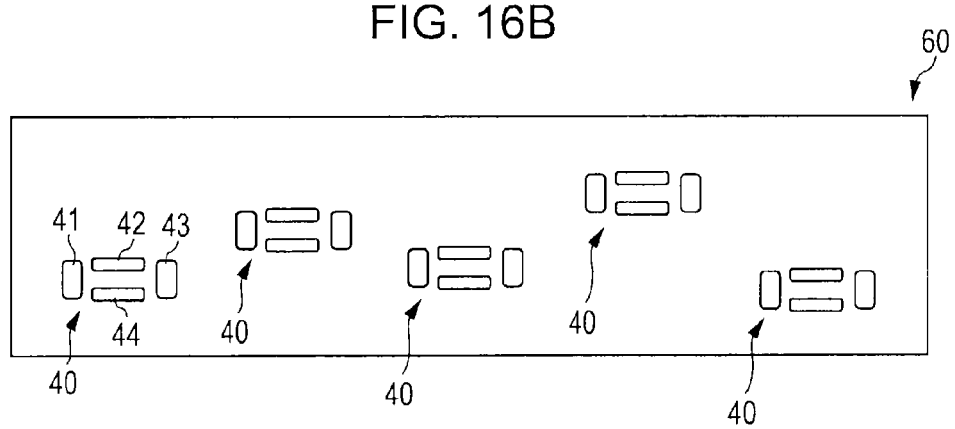
Figure 16C:
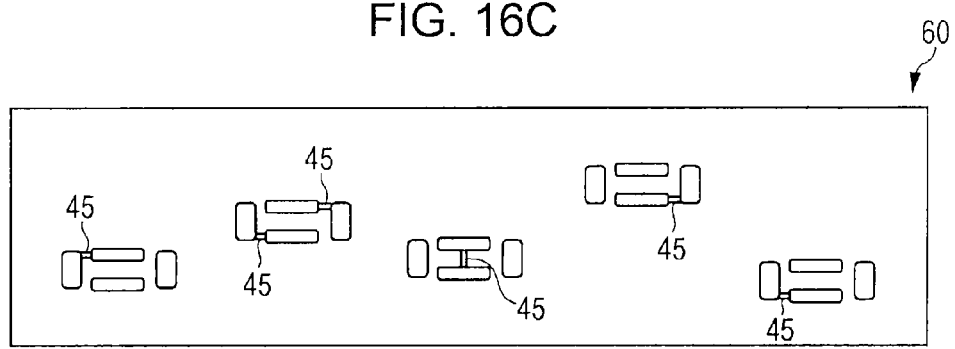

As shown in FIG. 16(*a*), the chip component 10 is provided in a circuit substrate 60. The substrate 60 is provided by laminating dielectric substrate configuration layers 48, and at least a conductor pattern, a GND, etc. 32 are provided on the surface of the substrate. In that example, the chip component 10 is incorporated into a hollow 49 provided inside the substrate 60. The above-described input and output terminals 11 and adjustment terminals 12 of the chip component 10 are mounted on a single substrate configuration layer 48 (the foot pattern thereof) with solder 33 on the under face of the chip component 10. The foot pattern of the substrate configuration layer 48 where the chip component 10 is mounted is electrically connected to a land pattern 40 provided on the back face of the substrate 60 through a via 34 as shown in FIG. 16(*b*). Here, the land pattern 40 corresponds to the pads 21 to 24 of the above-described foot pattern 20 for the sizes and arrangement positions of lands 41 to 44 that are included therein. However, when the pads 21 to 24 are electrically connected to the lands 41 to 44, the sizes and the positions thereof may not necessarily agree with one another. At any rate, establishing connections between the lands of the land pattern 40 is equivalent to establishing connections between the pads of the corresponding foot pattern 20.

For each of the chip components 10, connections are established among the lands 41 to 44 of the land pattern 40 of the back face of the substrate 60 where the chip component 10 is mounted as shown in FIG. 16(*c*). Accordingly, different values can be obtained as the constant through the use of the same chip component. Therefore, the value (or property) of each of the chip components is changed by establishing a connection between desired lands so that the optimization of the circuit is executed. The pattern of connections among the lands 41 to 44 are equivalent to the pattern of connections between the pads of the above-described foot pattern. As the connection member 45, various styles, the DC/AC connection, the addition of specified effects, etc. can be adopted as is the case with the above-described connection member 25.

Further, according to the configuration of the circuit substrate 60 shown in FIG. 16, the land pattern 40 is externally exposed. However, for a circuit substrate (e.g., a mass-produced substrate) obtained after adjusting the constant of the chip component (that is, after determining the connection pattern), the land pattern may not necessarily be exposed at the back face of the substrate. For example, it becomes possible to intentionally place the land pattern on an inner layer of the substrate by adding a substrate configuration layer to the substrate-back face where the land pattern is exposed after the constant is adjusted.

The method of establishing connections between the lands of the land pattern 40 provided on the back face of the substrate 60 where the chip component 10 is mounted as is the case with the configurations shown in FIG. 16 provides the advantage of making the adjustment of the constant of the chip component with facility after the chip component is mounted on the substrate 60.

Figure 17:
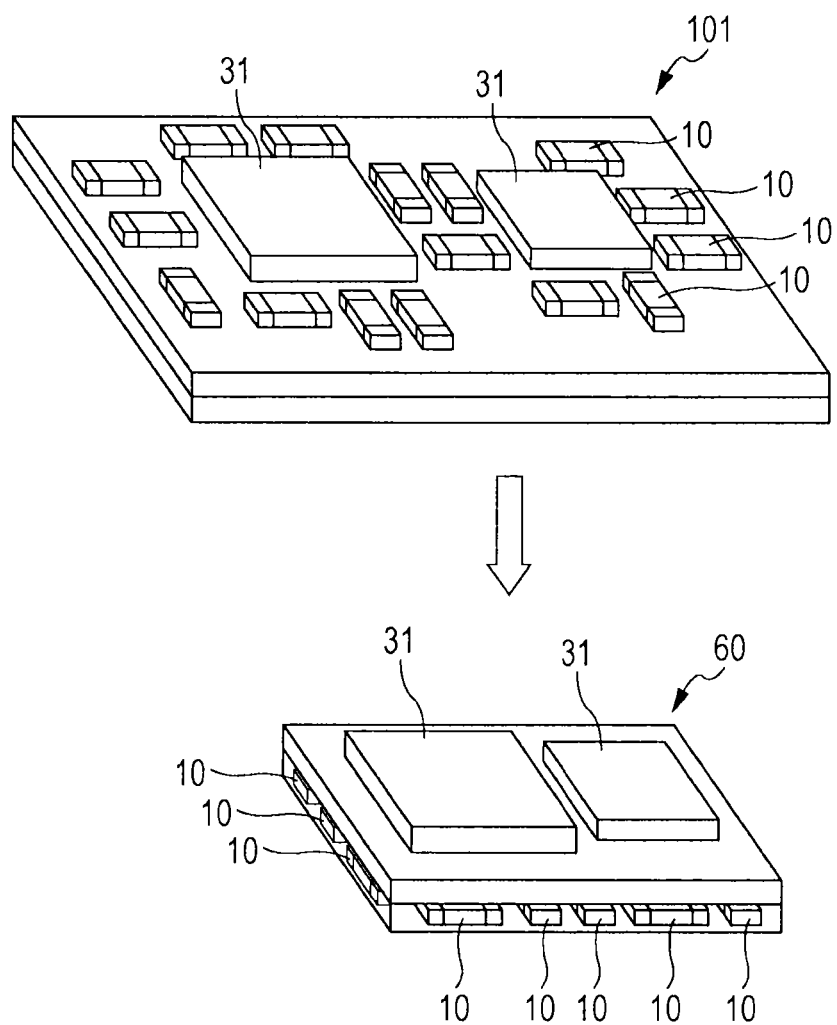
FIG. 17 is a diagram illustrating the advantage of configurations of the circuit substrate shown in FIG. 16.

As shown in FIG. 17, the size of a circuit substrate (particularly, the area of the substrate face, that is, the projection area) can be decreased by mounting the chip components 10 in a substrate according to the configuration of a circuit substrate 60 shown in FIG. 16, compared to the configuration of a known circuit substrate 101, where a plurality of the chip components 10 is mounted on the surface of the substrate.

Figure 18:
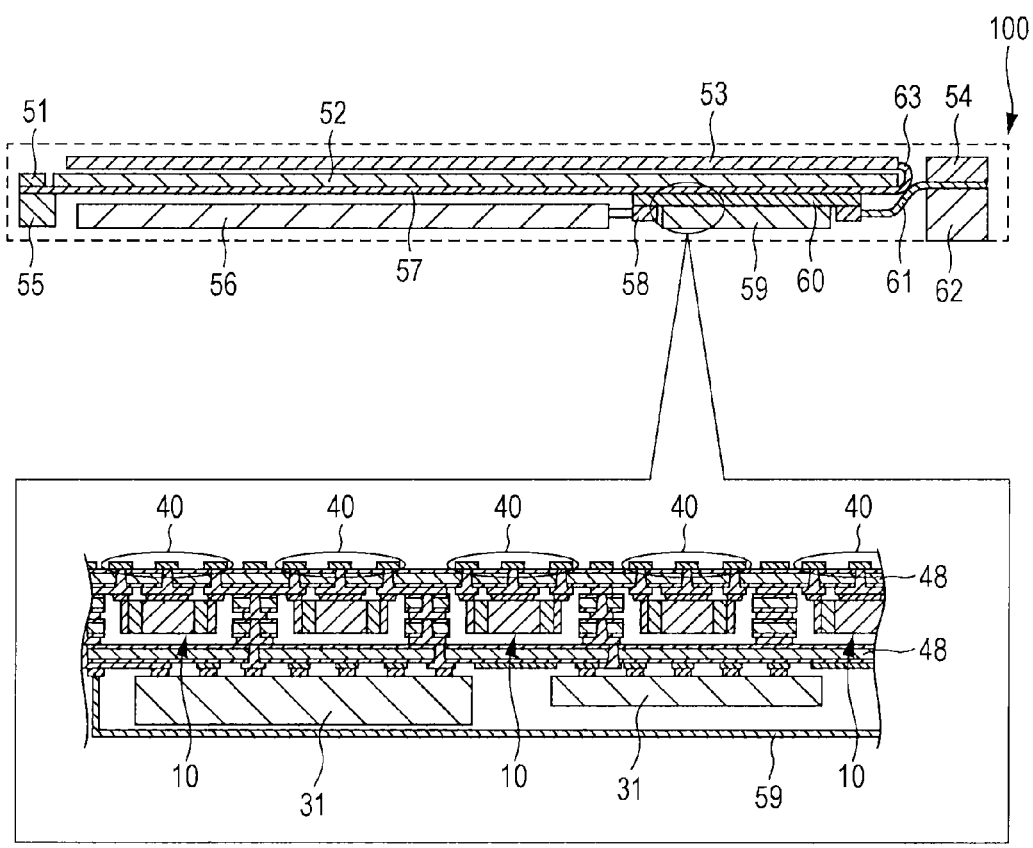
FIG. 18 illustrates an application of the circuit substrate shown in FIG. 16 to a mobile-phone terminal.

As shown in FIG. 18, the configuration of the circuit substrate 60 shown in FIG. 16 can be applied for a circuit substrate used for a mobile-phone terminal (e.g., a so-called smart phone).

A mobile-phone terminal 100 includes the above-described circuit substrate 60. Additionally, the mobile-phone terminal 100 is provided with a microphone 51, an LCD 53 with a touch panel, a sounder (speaker with the vibration function) 54, an antenna 55, an internal battery 56, and a camera 62. The antenna 55 is connected to the substrate 60 via an RF-enabled flexible substrate 57. The internal battery 56 is connected to the substrate 60 via the battery connector 58. The sounder 54 or the camera 62 is connected to the substrate 60 via a flexible substrate 61. Further, the LCD 53 is connected to the substrate 60 via a flexible substrate 63. The LCD 53 is held with a LCD-holder metal plate 52.

As described above, the chip component 10 is mounted in the circuit substrate 60, and the constant (or impedance and/or property) is adjusted by establishing connections between the lands of the land pattern 40 provided on the substrate-back face. A face of the circuit substrate 60, where a component such as an IC 31 is mounted thereon, is covered with a shield 59.

As described above, according to the present embodiment, the constant (or impedance and/or property) can be changed without replacing the chip component. The meaning of the "change of the constant (or impedance or property)" is not limited to the change of the constant (or impedance and/or property) between the same circuit elements, such as changing the C from 1 pF to 10 pF, but includes the change of the circuit element, which is exemplarily expressed as the C to the L, and the change of the circuit, which is expressed as C+R→L+C (the change of a combination of the circuit elements).

According to a configuration where the chip component is provided in the circuit substrate, the circuit can be optimized without replacing the chip component. As a result, the number of times prototyping is performed is significantly reduced and the development period can be shortened. Further, the prototyping cost can be significantly reduced.

Further, a circuit having a low tolerance to the property change (that is, a circuit which calls for the constant precision) can be provided in a substrate without any trouble. Consequently, the circuit substrate can be easily reduced in size (the projection area can be reduced).

Thus, the preferred embodiments of the present invention have been described. However, the invention can cover various modifications and changes in addition to those stated above. That is, it is to be understood by those skilled in the art that various alterations, combinations, another embodiment may occur due to designs or other elements according to the appended claims or within scope equivalent to the appended claims.

In the above-described embodiment of the present invention, a chip component is provided with a block including a dielectric, first and second terminals that are provided on a surface of the block, a third terminal that includes an internal electrode extended into the block and that is provided on the surface of the block, and at least two inter-terminal circuits that are provided in the block and that are connected between at least two sets of two terminals of the first, second, and third terminals is described.

Further, the chip component, wherein the first, second, and third terminals are exposed at least one face of the block as connection terminals, is also described.

Further, the chip component, wherein when the chip component is mounted on a circuit substrate, the connection terminals abut on first, second, and third pads of a foot pattern provided on a face of the circuit substrate where the chip component is mounted, and a state of connections between arbitrary pads of the first, second, and third pads is changed so that a constant of the chip component can be adjusted, is also described.

Further, the chip component, wherein the third terminal has a width covering the entire arrangement range of the internal electrode irrespective of an arrangement position of the internal electrode, is also described.

Further, the chip component, wherein the at least two inter-terminal circuits are configured as circuit elements of the same type, is also described.

Further, the chip component, wherein the at least two inter-terminal circuits are configured as circuit elements of different types, is also described.

Further, a chip-component mounting structure provided to mount a chip component on a circuit substrate, wherein the chip component is provided with a block including a dielectric, first and second terminals that are provided on a surface of the block, a third terminal that includes an internal electrode extended into the block and that is provided on the surface of the block, and at least two inter-terminal circuits that are provided in the block and that are connected between at least two sets of two terminals, of the first, second, and third terminals, and wherein when the chip component is mounted on the circuit substrate, the connection terminals abut on first, second, and third pads of a foot pattern provided on a face of the substrate, and a state of connections between arbitrary pads of the first, second, and third pads is changed so that a constant of the chip component can be adjusted, is also described.

Further, the chip-component mounting structure, wherein the connection between the arbitrary pads of the first, second, and third pads is a DC connection, is also described.

Further, the chip-component mounting structure, wherein the connection between the arbitrary pads of the first, second, and third pads is an AC connection, is also described.

Further, the chip-component mounting structure, wherein the connection between the arbitrary pads of the first, second, and third pads is established via a circuit, is also described.

Further, a circuit substrate provided with
a dielectric substrate, and
a chip component mounted in the dielectric substrate,
wherein the chip component includes
a block including a dielectric,
first and second terminals that are provided on a surface of the block,
a third terminal that includes an internal electrode extended into the block and that is provided on the surface of the block, and
at least two inter-terminal circuits that are provided in the block and that are connected between at least two sets of two terminals of the first, second, and third terminals, and
wherein the first, second, and third terminals of the chip component are individually connected to first, second, and third pads of a land pattern provided on a back face of the substrate and a state of connections between arbitrary lands of the first, second, and third lands is changed so that a constant of the chip component can be adjusted, is also described.

REFERENCE SIGNS LIST 10, 10a, 10b, and 10c: chip component
11: input and output terminal
12: adjustment terminal
12a: internal electrode
13: dielectric block
14: inter-terminal circuit
14a: condenser
14b: inductor
14c: resistor
15: electrode plate
16: dielectric sheet
17: slit
20, 20b, 20c, and 20d: foot pattern
21-24: pad
25: connection member
32: pattern, GND, etc.
33: solder
34: via
40: land pattern
41-44: land
45: connection member
47: chip component
48: substrate configuration layer
49: hollow
60: circuit substrate
100: mobile-phone terminal
101: circuit substrate

The invention claimed is:

1. A chip component comprising:
a block including:
a dielectric;
a first terminal and a second terminal that are provided on a surface of the block;
a third terminal including a single electrode that includes
a first portion provided on the surface of the block and
a second portion that extends into the block; and
an inter-terminal circuit provided in the block and connected between at least two of the first terminal, the second terminal, or the second portion of the single electrode of the third terminal.

2. The chip component of claim 1, further comprising:
another inter-terminal circuit provided in the block and connected between at least two of the first terminal, the second terminal, or the second portion of the single electrode of the third terminal.

3. The chip component of claim 2, wherein
the first terminal, the second terminal, and the third terminal are exposed at least on one face of the block and positioned to electrically connect to opposing footpads disposed on a face of a circuit substrate.

4. The component of claim 3, wherein
a constant of the chip component is changed when the first terminal, the second terminal, and the third terminal are electrically connected to said opposing footpads.

5. The component of claim 3, wherein
the inter-terminal circuit is a capacitance element, and said opposing footpads include a first footpad, a second footpad, and a third footpad, and
an inter-input and output-terminal capacitance of the chip component changes with interconnections between the first footpad, the second footpad, and the third footpad.

6. The component of claim 3, wherein
the inter-terminal circuit is an inductive element, and said opposing footpads include a first footpad, a second footpad, and a third footpad, and
an inter-input and output-terminal inductance of the chip component changes with interconnections between the first footpad, the second footpad, and the third footpad.

7. The component of claim 3, wherein
the inter-terminal circuit is a resistance element, and said opposing footpads include a first footpad, a second footpad, and a third footpad, and
an inter-input and output-terminal resistance of the chip component changes with interconnections between the first footpad, the second footpad, and the third footpad.

8. The component of claim 3, further comprising:
a capacitance element, an inductive element, and an resistance element disposed in the block and each electrically connected to two of the first terminal, the second terminal, or the second portion of the single electrode of the third terminal, wherein
said opposing footpads include a first footpad, a second footpad, and a third footpad, and
an inter-input and output-terminal impedance of the chip component changes with interconnections between the first footpad, the second footpad, and the third footpad.

9. The chip component of claim 3, wherein
when a first pad of said opposing footpads is electrically connected to a second pad of said opposing footpads, but not electrically connected to a third pad of said opposing footpads, a constant of said block is changed by the inter-terminal circuit but not said another inter-terminal circuit.

10. The chip component of claim 9, wherein
said first pad is electrically connected to said second pad via a direct circuit connection.

11. The chip component of claim 9, wherein
said first pad is electrically connected to said second pad via an alternation circuit connection.

12. The chip component of claim 9, wherein
said first pad is electrically connected to said second pad via an external circuit component.

13. The chip component of claim 9, wherein
said first pad is electrically connected to said second pad via a plurality of external circuit components.

14. The chip component of claim 3, wherein said opposing foot pads include a first pair of opposing foot pads abutting the first terminal and the second terminal, and a second pair of opposing foot pads abutting the third terminal.

15. The chip component of claim 14, wherein
adjusting connections between said opposing footpads changes a constant of the chip component, and
said constant of the chip component includes at least one of a resistance, an inductance, or a capacitance.

\* \* \* \* \*